(12) United States Patent
Katsuki et al.

(10) Patent No.: US 9,973,175 B2
(45) Date of Patent: May 15, 2018

(54) CONTROL APPARATUS AND TUNABLE FILTER APPARATUS

(71) Applicant: KABUSHIKI KAISHA TOSHIBA, Tokyo (JP)

(72) Inventors: Rie Katsuki, Kanagawa (JP); Hiroshi Takahashi, Kanagawa (JP); Junya Tanaka, Tokyo (JP); Hiroaki Ikeuchi, Kanagawa (JP); Hiroyuki Kayano, Kanagawa (JP); Noritsugu Shiokawa, Kanagawa (JP); Tamio Kawaguchi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 152 days.

(21) Appl. No.: 15/062,929

(22) Filed: Mar. 7, 2016

(65) Prior Publication Data

US 2016/0301389 A1 Oct. 13, 2016

(30) Foreign Application Priority Data

Apr. 13, 2015 (JP) ................................. 2015-081948

(51) Int. Cl.
*H03J 7/16* (2006.01)
*H01P 1/20* (2006.01)
*H05K 1/02* (2006.01)

(52) U.S. Cl.
CPC .................. *H03J 7/16* (2013.01); *H01P 1/20* (2013.01); *H05K 1/0203* (2013.01)

(58) Field of Classification Search
CPC .. H03J 7/16; H05K 1/0203; H01P 1/20–1/219
See application file for complete search history.

(56) References Cited

U.S. PATENT DOCUMENTS

| 3,715,690 | A | * | 2/1973 | Young | H03H 7/0123 |
| | | | | | 333/17.1 |
| 6,791,430 | B2 | * | 9/2004 | Borzenets | H01P 1/20336 |
| | | | | | 333/17.1 |
| 6,937,117 | B2 | * | 8/2005 | Terashima | H01P 1/203 |
| | | | | | 333/205 |
| 7,174,197 | B2 | * | 2/2007 | Kai | H01P 1/202 |
| | | | | | 333/202 |

(Continued)

FOREIGN PATENT DOCUMENTS

| JP | 2002-149204 | 5/2002 |
| JP | 2005-276169 | 10/2005 |

(Continued)

*Primary Examiner* — Dean Takaoka
*Assistant Examiner* — Alan Wong
(74) *Attorney, Agent, or Firm* — Finnegan, Henderson, Farabow, Garrett & Dunner, L.L.P.

(57) ABSTRACT

According to an embodiment, a control apparatus includes a shaper and a compensator. The shaper receives a first target value in position control of a controlled object and generates a second target value which changes substantially rampwise over a time equal to or shorter than a period corresponding to one of resonance frequencies of the controlled object until the second target value becomes equal the first target value. The compensator compensates for a control signal, used for controlling the controlled object, based on the second target value.

9 Claims, 20 Drawing Sheets

(56) References Cited

U.S. PATENT DOCUMENTS

| | | | |
|---|---|---|---|
| 7,567,145 B2* | 7/2009 | Akasegawa | H01P 1/20354 333/205 |
| 7,650,174 B2* | 1/2010 | Aoki | H01P 1/20381 333/205 |
| 2005/0192681 A1 | 9/2005 | Matsunaga et al. | |
| 2009/0167460 A1 | 7/2009 | Akasegawa et al. | |

FOREIGN PATENT DOCUMENTS

| | | |
|---|---|---|
| JP | 2008-28835 | 2/2008 |
| JP | 2015-100097 | 5/2015 |
| WO | WO 2015/076007 | 5/2015 |

* cited by examiner

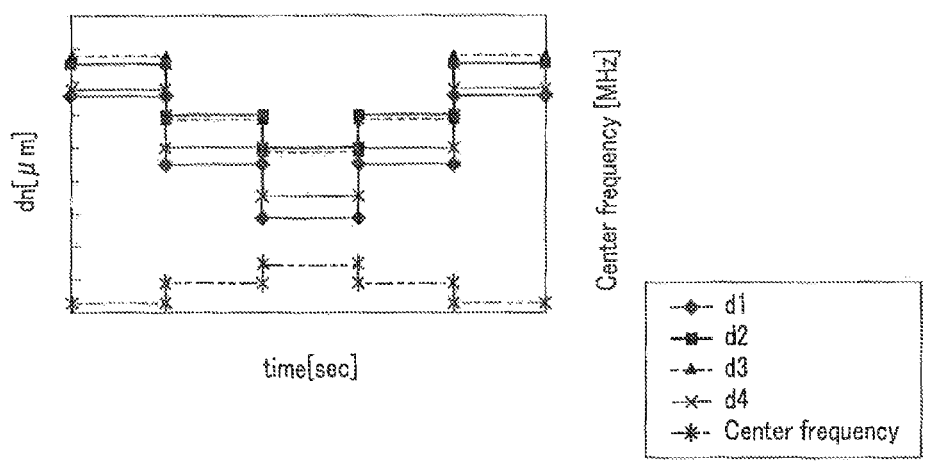
F I G. 27
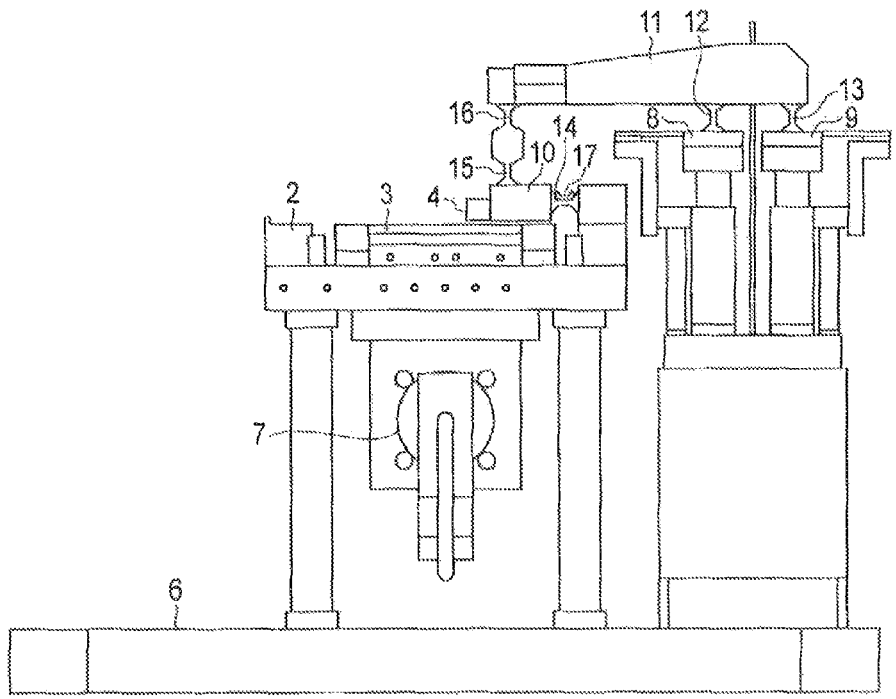
F I G. 28

US 9,973,175 B2

CONTROL APPARATUS AND TUNABLE FILTER APPARATUS

CROSS-REFERENCE TO RELATED APPLICATIONS

This application is based upon and claims the benefit of priority from Japanese Patent Application No. 2015-081948, filed Apr. 13, 2015, the entire contents of which are incorporated herein by reference.

FIELD

Embodiments described herein relate generally to position control.

BACKGROUND

The position control for various objects has been performed using a driving element such as an actuator. For example, a tunable filter apparatus known in the art is capable of changing filter characteristics by moving a characteristic tuning member (e.g., a dielectric) closer to or away from a filter substrate. The filter characteristics of a bandpass type tunable filter apparatus, such as a center frequency of a passband, a passband width, etc., can be flexibly adjusted in accordance with a change in the condition in which the apparatus is used.

Typically, when a controlled object is moved rapidly, the position thereof overshoots a target position. Therefore, if the characteristic tuning member of the tunable filter apparatus is rapidly moved closer to the filter substrate, it may collide with the filter substrate, causing damage to the filter substrate.

BRIEF DESCRIPTION OF THE DRAWINGS

FIG. 27 is a graph illustrating how the frequency characteristic of the tunable filter apparatus of the third embodiment changes.

FIG. 28 is a sectional view of a tunable filter apparatus according to a comparative example.

DETAILED DESCRIPTION

Embodiments will be described hereinafter with reference to drawings.

According to an embodiment, a control apparatus includes a shaper and a compensator. The shaper receives a first target value in position control of a controlled object and generates a second target value which changes substantially rampwise over a time equal to or shorter than a period corresponding to one of resonance frequencies of the controlled object until the second target value becomes equal the first target value. The compensator compensates for a control signal, used for controlling the controlled object, based on the second target value.

According to another embodiment, a tunable filter apparatus includes a substrate, a plurality of resonators, a plurality of characteristic tuning members, and a plurality of tunable mechanisms. The resonators are formed on a first surface of the substrate by patterning, using a conductive material. The characteristic tuning members comprise at least one of a dielectric material, a magnetic material and a conductive material. The tunable mechanisms support the characteristic tuning members such that the characteristic tuning members face the resonators and control the characteristic tuning member based on a control signal. The control signal changes in accordance with a desired filter characteristic. The tunable mechanisms individually move the characteristic tuning members in a common direction in response to a change in the control signal.

In the descriptions below, the same respective reference numbers will be used to denote elements similar or corresponding to described elements, and redundant explanations will be omitted.

First Embodiment

Figure 1:
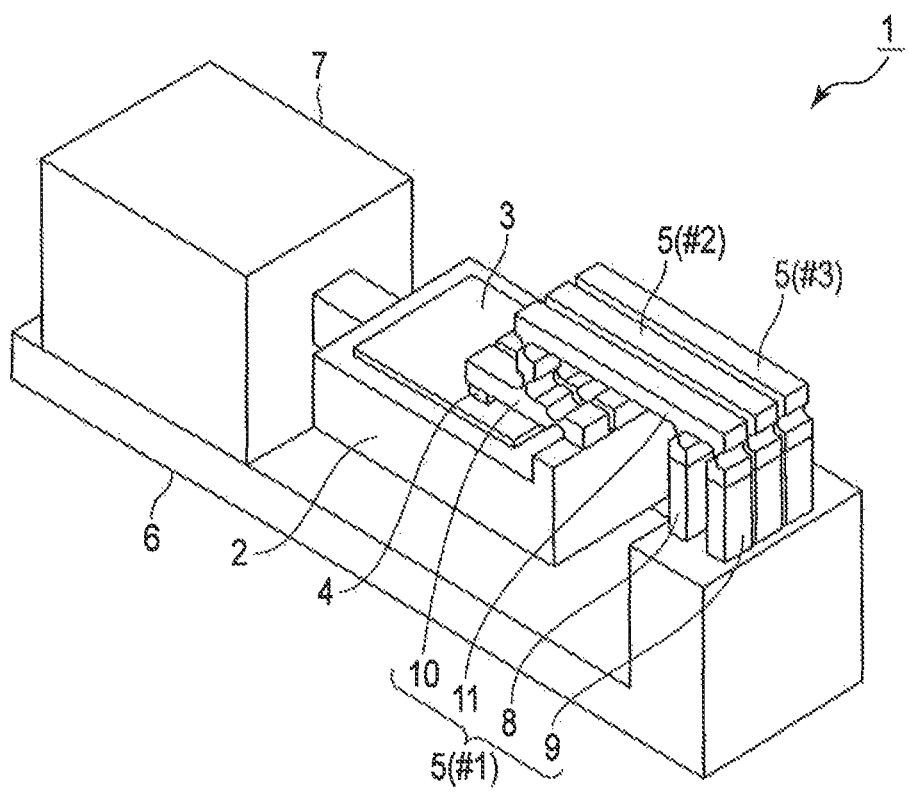
FIG. 1 is a perspective view of an example of a tunable filter apparatus to which a control apparatus according to the first embodiment is applicable.

A control apparatus according to the first embodiment is applicable to a band-pass type tunable filter apparatus 1, such as that depicted in FIG. 1. The tunable filter apparatus 1 comprises a cold plate 2, a superconducting filter substrate 3, a characteristic tuning member 4, a tunable mechanism 5, a base 6 and a refrigerator 7.

The cold plate 2 is a plate-like member, and the superconducting filter substrate 3 is arranged on the first surface of the cold plate 2. The cold plate 2 is cooled by the refrigerator 7. The cold plate 2 can keep the superconducting filter substrate 3 in a low-temperature state. The "low temperature" mentioned herein is a temperature not higher than a temperature at which a superconducting material described later exhibits a superconducting characteristic. To enhance the cooling efficiency, the cold plate 2 may be secured by the refrigerator 7 in such a manner that the cold plate 2 is thermally insulated from the base 6.

The refrigerator 7 is supported on the base 6. The refrigerator 7 is only required to cool the superconducting filter substrate 3 fully, and may be one of various types of refrigerators, including a pulse tube refrigerator, a Stirling refrigerator, a Gifford-McMahon (GM) refrigerator, etc.

The superconducting filter substrate 3 is a dielectric substrate which is made of a low-loss material having a small dielectric dissipation factor, such as $AL_2O_3$ (sapphire), MgO, or $LaAlO_3$, and which is formed substantially as a plate. Circuit elements (e.g., a resonator) are formed on the first surface of the superconducting filter substrate 3, using a superconducting material. These circuit elements can be formed in the patterning method and are provided by forming a superconducting film on the first surface, using a Y—Ba—Cu—O based superconducting material (hereinafter referred to as YBCO), and working the superconducting material by photolithography. The total number of resonators provided (three resonators in the example shown in FIG. 1) and the positions where they are provided are determined, depending upon various conditions, such as a filter characteristic required of the tunable filter apparatus employing the resonators.

As a superconducting material, an R—Ba—Cu—O based material (R is Nb, Ym, Sm or Ho), a Bi—Sr—Ca—Cu—O based material, a Pb—Bi—Sr—Ca—Cu—O based material, a $CuBa_pCa_qCu_rO_x$, based material ($1.5<p<2.5$, $2.5<q<3.5$, and $3.5<r<4.5$) or another oxide superconducting material may be used, replacing the YBCO described above. In addition, a metallic superconducting material, such as niobium or niobium tin, may be used. A material for the circuit elements need not be a superconducting material; it may be a conductive material.

Typically, the characteristic tuning member 4 includes a dielectric material such as alumina or sapphire, or a magnetic material. Alternatively, the characteristic tuning member 4 may include a conductive material such as metal. The characteristic tuning member 4 is supported by the tunable mechanism 5 in such a manner that it faces the first surface of the superconducting filter substrate 3, with a gap maintained in between. To be more specific, the characteristic tuning member 4 faces the resonator provided on the first surface of the superconducting filter substrate 3.

Typically, the characteristic tuning member 4 is formed as a columnar member, such as a circular cylinder or a rectangular cylinder. The characteristic tuning member 4 may be supported in such a manner that its bottom surface is substantially parallel to the first surface of the superconducting filter substrate 3. The size of the bottom surface of the characteristic tuning member 4 may be determined in accordance with the dimension of the shorter side of the resonator. It is assumed here that both the longer sides and shorter sides of the resonator are substantially parallel to the first surface of the superconducting filter substrate 3.

If the characteristic tuning member 4 moves, for example, in a direction perpendicular to the first surface of the superconducting filter substrate 3, the gap length between the resonator and the bottom surface of the characteristic tuning member 4 changes. The resonance frequency of the resonator changes in accordance with changes in the gap length. More specifically, the center frequency of the pass band of the tunable filter apparatus 1 increases in accordance with an increase in the gap length. Conversely, the center frequency of the pass band of the tunable filter apparatus 1 decreases in accordance with a decrease in the gap length.

Where a plurality of resonators are arranged on the first surface of the superconducting filter substrate 3, the number of characteristic tuning members 4 and the number of tunable mechanisms 5 may be the same as the number of resonators. In the example shown in FIG. 1, three characteristic tuning members 4 and three tunable mechanisms 5 are employed. Each of the characteristic tuning members 4 is supported by the tunable mechanism 5 in such a manner that it faces the corresponding resonator. The gap lengths between the characteristic tuning members 4 and their corresponding resonators may be adjustable individually or collectively.

Figure 2:
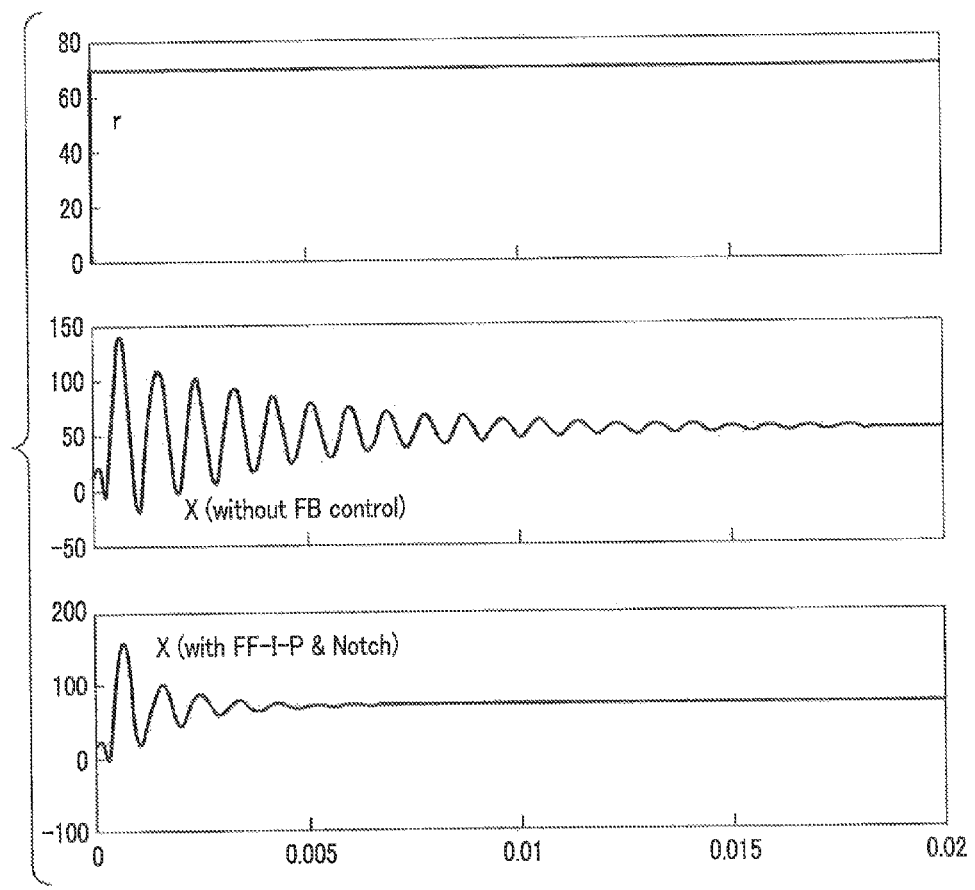
FIG. 2 shows graphs representing how a target value changes and how the position of a characteristic tuning member changes when the target value is provided.

The tunable mechanism 5 supports the characteristic tuning member 4 and moves the characteristic tuning member 4 in accordance with a control signal supplied from a control apparatus (not shown in FIG. 1). If the target position (r) of the characteristic tuning member 4 changes stepwise, the position (x) of the characteristic tuning member 4 overshoots the target position, as shown in FIG. 2. FIG. 2 shows examples of how the position (x) of the characteristic tuning member 4 changes when no feedback control is applied to the control apparatus and when not only feedforward-integral-proportional (FF-I-P) control but also notch filtering are applied to the control apparatus.

To be more specific, the tunable mechanism 5 comprises piezoelectric element 8, piezoelectric element 9, lever 10, lever 11, elastic hinge 12, elastic hinge 13, elastic hinge 14, elastic hinge 15, elastic hinge 16 and a strain gauge 17. The tunable mechanism 5 is driven by a control apparatus 18, mentioned later.

Piezoelectric elements 8 and 9 are substantially columnar and are supported on the base 6. Piezoelectric elements 8 and 9 comprise first ends fixed to the base 6. Piezoelectric element 8 comprises a second end which is connected, via elastic hinge 12, to a position near the first end of lever 11. Piezoelectric element 9 comprises a second end which is connected, via elastic hinge 13, to a position near the first end of lever 11. Piezoelectric elements 8 and 9 extend or contract in accordance with the respective driving voltages 24*a* and 24*b* applied by the control apparatus 18, thereby providing lever 11 with a driving force.

The characteristic tuning member 4 is attached to the first end of lever 10, and the second end of lever 10 is connected, via elastic hinge 14, to the cold plate 2 or base 6, by which the second end is supported. The second end of lever 11 is coupled, via elastic hinges 15 and 16, to a position between the first and second ends of lever 10.

The first end of lever 10 moves in accordance with the driving force transmitted from lever 11. To be specific, the first end of lever 10 moves in a direction substantially perpendicular to the first surface of the superconducting filter substrate 3. Since the characteristic tuning member 4 moves together with the first end of lever 10, the gap length mentioned above changes. Lever 11 transmits the driving force applied thereto by the piezoelectric elements 8 and 9 to lever 10.

To detect the distortion caused by the deformation of elastic hinge 14, the strain gauge 17 is attached in the neighborhood of elastic hinge 14. The strain gauge 17 may be substituted by another type of sensor that can detect the distortion. The position of the characteristic tuning member 4 can be derived from the detected distortion. The strain gauge 17 supplies a sensor signal, which represents the detected distortion, to the control apparatus 18.

The piezoelectric elements 8 and 9 can be driven in various ways.

Figure 4A:
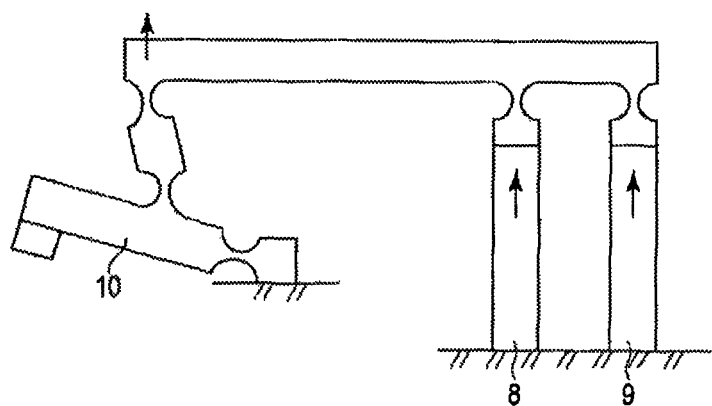
FIG. 4A is a diagram illustrating how a piezoelectric element depicted in FIG. 1 is driven.

To be specific, the piezoelectric elements 8 and 9 can be driven in the same direction, as shown in FIG. 4A (first driving method). In the example shown in FIG. 4A, lever 11 entirely interlocks with the piezoelectric elements 8 and 9, and the first end of lever 10 interlocks with lever 11. In other words, when the piezoelectric elements 8 and 9 extend, the characteristic tuning member 4 moves upward, increasing the gap length. Conversely, when the piezoelectric elements 8 and 9 contract, the characteristic tuning member 4 moves downward, decreasing the gap length.

Figure 4B:
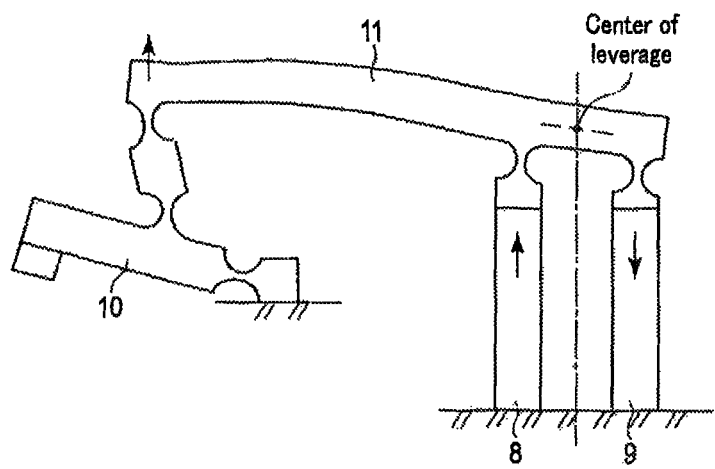
FIG. 4B is a diagram illustrating how the piezoelectric element depicted in FIG. 1 is driven.

As shown in FIG. 4B, the piezoelectric elements 8 and 9 can be driven in opposite directions (second driving method). In the example shown in FIG. 4B, lever 11 rotates in accordance with the directions in which the piezoelectric elements 8 and 9 are driven, and the first end of lever 10 interlocks with the second end of lever 11. When piezoelectric element 8 extends and piezoelectric element 9 contracts, the characteristic tuning member 4 moves upward, increasing the gap length. Conversely, when the piezoelectric element 8 contracts and piezoelectric element 9 extends, the characteristic tuning member 4 moves downward, decreasing the gap length.

Figure 4C:
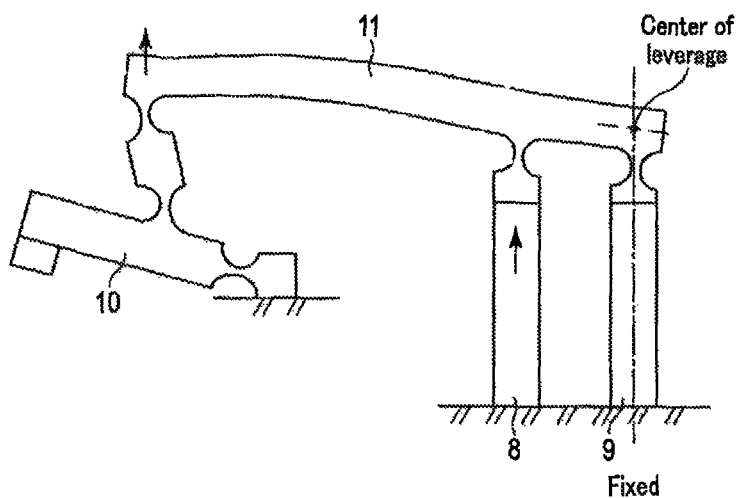
FIG. 4C is a diagram illustrating how the piezoelectric element depicted in FIG. 1 is driven.
Figure 5A:
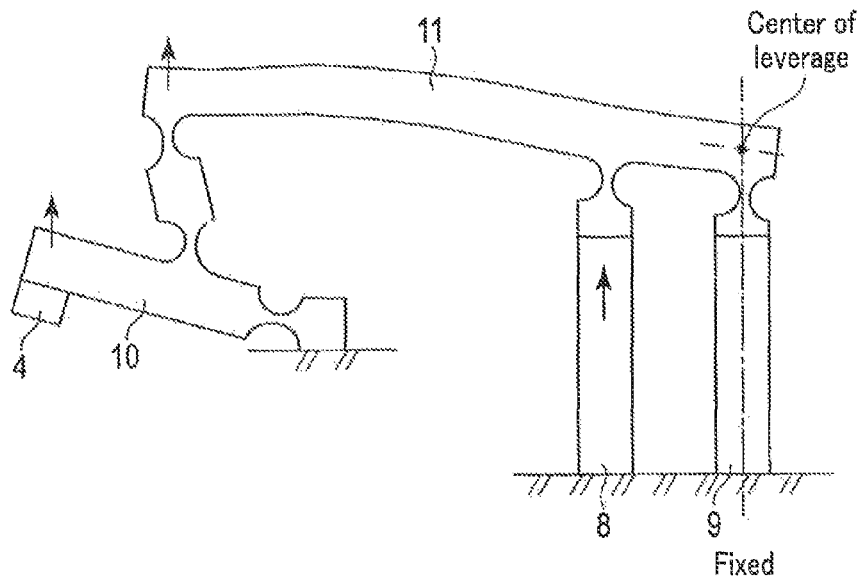
FIG. 5A is an explanatory diagram illustrating the driving method depicted in FIG. 4C.
Figure 5B:
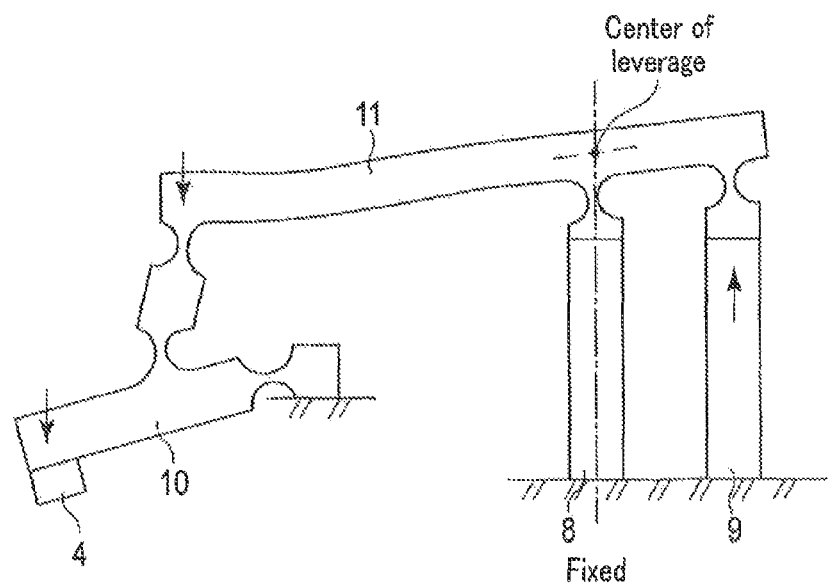
FIG. 5B is an explanatory diagram illustrating the driving method depicted in FIG. 4C.

As shown in FIG. 4C, one of the piezoelectric elements 8 and 9 may be fixed, and the other one may be driven (third driving method). In the example shown in FIG. 4C, lever 11 rotates in accordance with the direction in which piezoelectric element 8 is driven, and the first end of lever 10 interlocks with the second end of lever 11. As shown in FIG. 5A, when piezoelectric element 8 extends, with piezoelectric element 9 being fixed, the characteristic tuning member 4 moves upward, increasing the gap length. As shown in FIG. 5B, when piezoelectric element 9 extends, with piezoelectric element 8 being fixed, the characteristic tuning member 4 moves downward, decreasing the gap length.

The second and third driving methods utilize the principle of leverage, and are more advantageous than the first driving method in that the characteristic tuning member 4 can be displaced greatly. The third driving method corresponds to a 1-input and 1-output system in which one of piezoelectric elements 8 and 9 is controlled. Therefore, the third driving method is more advantageous than the second driving method in that a simple control algorithm is applicable. In the descriptions to be given below, it is assumed that the third driving method is adopted.

Based on a sensor signal fed back from the strain gauge 17, the control apparatus 18 predicts the present position of the characteristic tuning member 4 and generates driving voltage 24*a* applied to piezoelectric element 8 and driving voltage 24*b* applied to piezoelectric element 9 in such a manner that the characteristic tuning member 4 moves closer to the target position. By the feedback control, the control apparatus 18 enables the position of the characteristic tuning member 4 to converge to the target position.

To be specific, the control apparatus 18 comprises a signal processing circuit 19, a controller 21 and a driving circuit 23.

The signal processing circuit 19 receives a sensor signal from the strain gauge 17. By performing predetermined signal processing, the signal processing circuit 19 generates a position signal 20 which (implicitly) represents the current position of the characteristic tuning member 4. The signal processing circuit 19 supplies the position signal 20 to the controller 21.

The controller 21 receives a target value 25, representing the target position of the characteristic tuning member 4, and also receives a position signal 20 from the signal processing circuit 19. The target value 25 may be manually entered by the operator or may be entered by a processor (not shown) that executes a control program. Based on the position signal 20 and the target value 25, the controller 21 generates a control signal 22 for moving the characteristic tuning member 4 to move closer to the target position. The controller 21 preforms shaping processing (described later) for the target value 25 so that the overshooting of the characteristic tuning member 4 can be effectively suppressed. The controller 21 supplies the control signal 22 to the driving circuit 23.

Figure 6:
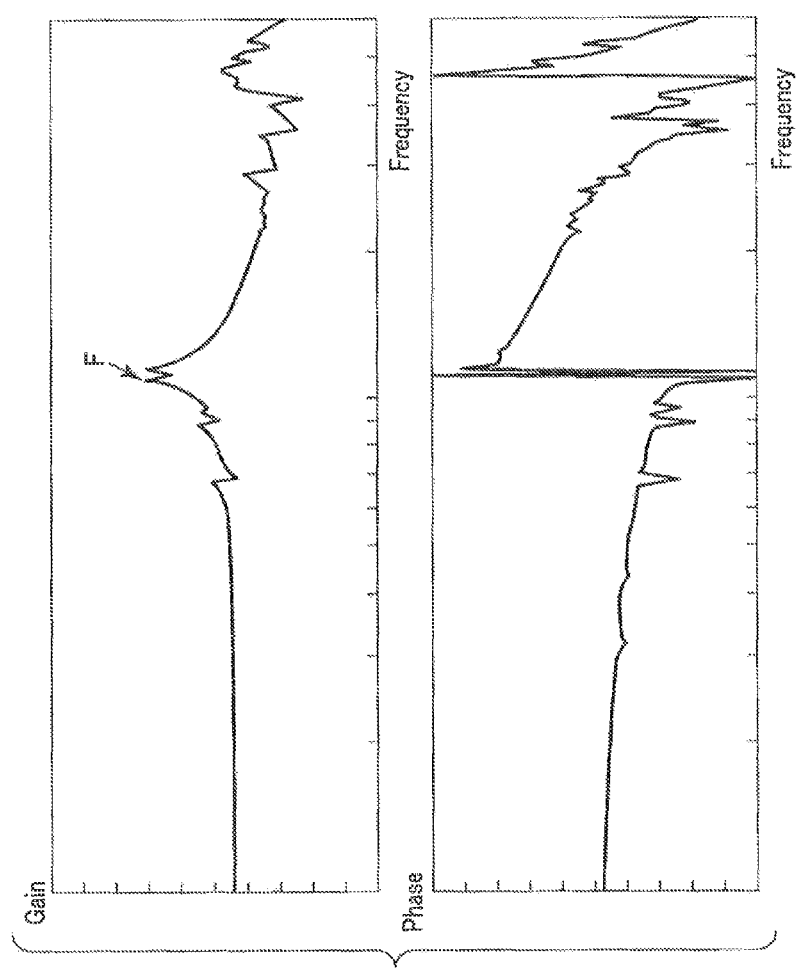
FIG. 6 is a Bode diagram illustrating an example in which the frequency characteristic of a sensor signal changes in relation to the frequency of a driving voltage applied to the piezoelectric element depicted in FIG. 3.
Figure 7:
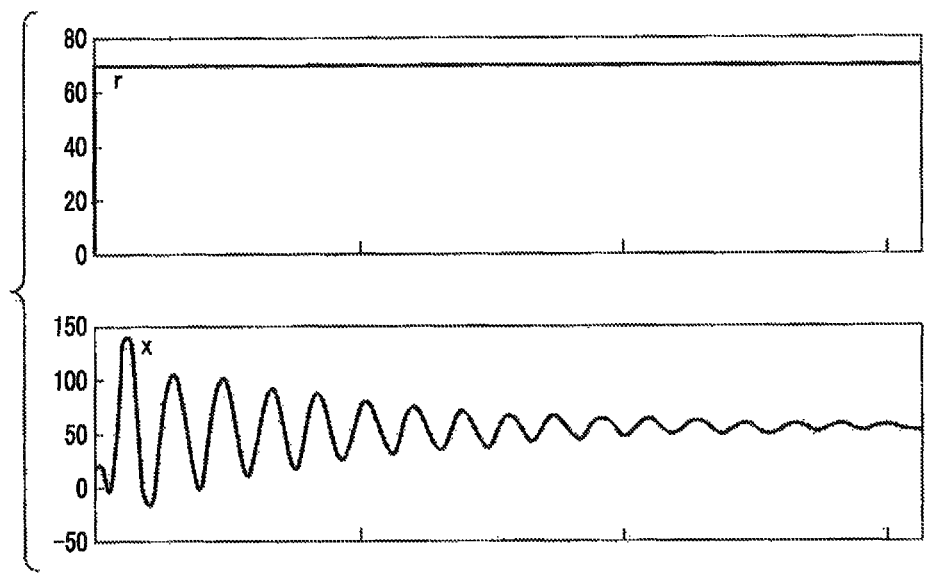
FIG. 7 shows graphs representing how a target value changes and how the position of a characteristic tuning member changes when the target value is provided.

The driving circuit 23 receives the control signal 22 from the controller 21. In accordance with the control signal 22, the driving circuit 23 generates driving voltage 24*a* and driving voltage 24*b* and applies them to piezoelectric elements 8 and 9, respectively.

Where piezoelectric element 9 is driven with piezoelectric element 8 being fixed, the sensor signal changes with reference to the frequency of driving voltage 24b (which is a sinusoidal wave signal) in the manner shown in FIG. 6. As mentioned above, the sensor signal is dependent on the position of the characteristic tuning member 4. The frequencies at which the gain characteristic shown in FIG. 6 reaches peaks correspond to the resonance frequencies of the characteristic tuning member 4. In the description below, frequency F at which the gain characteristic reaches the highest peak will be referred to as the main resonance frequency of the characteristic tuning member 4. Likewise, where piezoelectric element 8 is driven with piezoelectric element 9 being fixed, the main resonance frequency can be observed in the vicinity of frequency F [Hz].

Where driving voltage 24a and driving voltage 24h are generated based on target value 25(r) that changes stepwise, the position (x) of the characteristic tuning member 4 changes in such a manner as to wave, as shown in FIG. 7. In the example shown in FIG. 7, piezoelectric element 8 is fixed and piezoelectric element 9 is driven. In FIG. 7, the period of the wave which the position (x) of the characteristic tuning member 4 describes is substantially equal to the period corresponding to the main resonance frequency of the characteristic tuning member 4.

Figure 8:
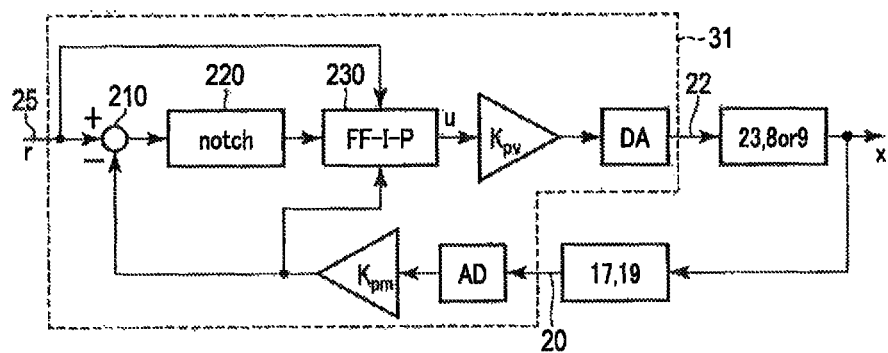
FIG. 8 is a block diagram illustrating a controller to which notch filtering is applied in addition to FF-I-P control.

As can be seen from FIG. 2, in the case where the notch filtering is applied in addition to the FF-I-P control, the position (x) of the characteristic tuning member 4 converges to the target position in a shorter time (i.e., the settling time is short) than in the case where no feedback control is applied. FIG. 8 illustrates an example of a controller 31 to which the notch filtering is applied in addition to the FF-I-P control. This controller 31 differs from the controller 21 employed in the present embodiment in that a target value shaper 200 (mentioned below) is not included.

The controller 31 includes a subtractor 210, a notch filter 220 and an FF-I-P compensator 230.

The subtractor 210 subtracts an estimate of the current position (x) from the target value 25(r), thereby obtaining a residual signal. The estimate of the current position (x) may be obtained, for example, by subjecting a position signal 20 output from the signal processing circuit 19 to analog-to-digital (AD) conversion and multiplying the resultant digital signal by a predetermined conversion gain ($K_{pm}$).

The notch filter 220 suppresses the unnecessary frequency components from the residual signal, thereby obtaining a residual signal subjected to filtering. For example, the notch filter 220 may suppress the frequency components in the neighborhood of the main resonance frequency. After this filtering processing is applied, the control signal 22 is hardly affected by the resonance of the characteristic tuning member 4, and the settling time can be shortened, accordingly.

The FF-I-P compensator 230 determines operation amounts (u) of piezoelectric element 8 and piezoelectric element 9 based on the target value 25(r) and the residual signal subjected to filtering processing. The control signal 22 may be generated, for example, by multiplying the operation amounts (u) by a predetermined conversion gain ($K_{pv}$) and subjecting the resultant product to digital-to-analog (DA) conversion.

Figure 9:
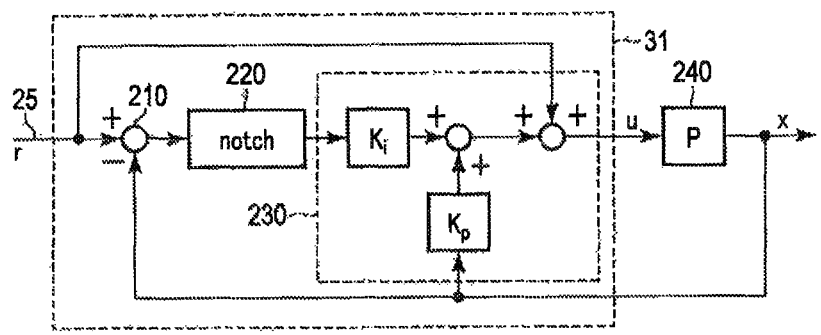
FIG. 9 is a block diagram corresponding to FIG. 8.

A block diagram of the controller 31 is shown in FIG. 9. An operation amount (u) corresponds to the sum of the FF term, the I term and the P term. The FF term corresponds to the target value 25(r) itself. Unlike a motor, the piezoelectric elements 8 and 9 restore their original shapes when the voltage applied to them is zero, and the characteristic tuning member 4 inevitably moves. Therefore, the restoration to the original shapes has to be compensated for by the FF term. The I term corresponds to a value obtained by multiplying a residual signal subjected to filtering processing by a predetermined coefficient ($K_i$), and therefore serves to suppress a steady-state deviation. The steady-state deviation is attributable to an error of $K_{pv}$, a measuring error in a Bode diagram, a change which the transfer function for transfer from an operation amount (u) to the position (x) of the characteristic tuning member 4 may undergo during the position control of the characteristic tuning member 4, etc. The "–P" term corresponds to a value obtained by multiplying the estimate of the current position (x) by a predetermined coefficient ($K_p$), and serves to suppress the external disturbance.

The plant 240 (P) shown in FIG. 9 is a combination of a driving circuit 23, one of piezoelectric elements 8 and 9 which is to be driven, a strain gauge 17 and a signal processing circuit 19. The plant 240 (P) corresponds to a transfer function for transfer from an operation amount (u) to the position (x) of the characteristic tuning member 4. The transfer function can be derived, for example, by analyzing the Bode diagram shown in FIG. 6.

Figure 10A:
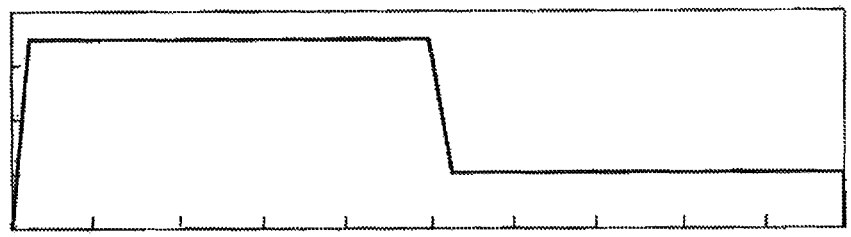
FIG. 10A is a graph representing an example in which a target value changes.

The notch filter 220 mentioned above may be omitted, and elements corresponding to part of the control terms of the FF-I-P compensator 230 may be omitted. To be more specific, when the target value 25(r) shown in FIG. 10A is provided, the position (x) of the characteristic tuning member 4 changes, as shown in FIG. 10B, FIG. 10C, FIG. 10D, FIG. 10E and FIG. 10F.

Figure 10B:
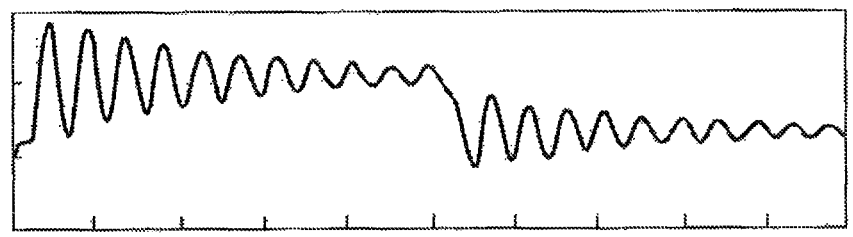
FIG. 10B is a graph representing how the position of a characteristic tuning member changes when the target value shown in FIG. 10A is provided.
Figure 10C:
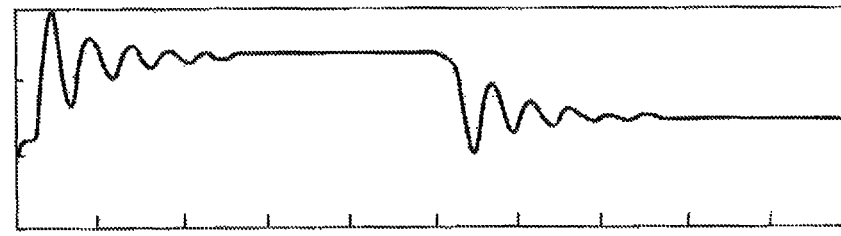
FIG. 10C is a graph representing how the position of a characteristic tuning member changes when the target value shown in FIG. 10A is provided.
Figure 10D:
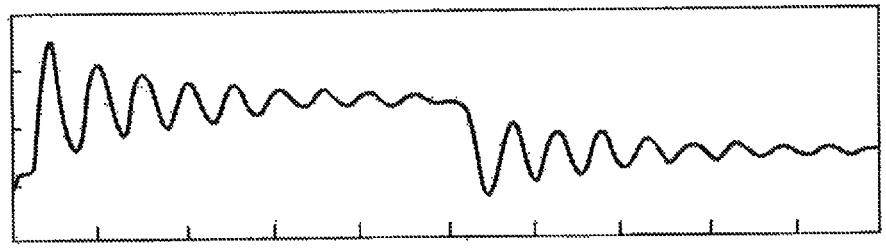
FIG. 10D is a graph representing how the position of a characteristic tuning member changes when the target value shown in FIG. 10A is provided.

FIG. 10B shows an example of how the position (x) of the characteristic tuning member 4 changes when neither the feedback control nor the notch filtering is applied. FIG. 10C shows an example of how the position (x) of the characteristic tuning member 4 changes when the FF-I-P control and the notch filtering are applied (i.e., the case where the controller 31 shown in FIGS. 8 and 9 is adopted). FIG. 10D shows an example of how the position (x) of the characteristic tuning member 4 changes when the FF-I-P control is applied but the notch filtering is not applied.

Figure 10E:
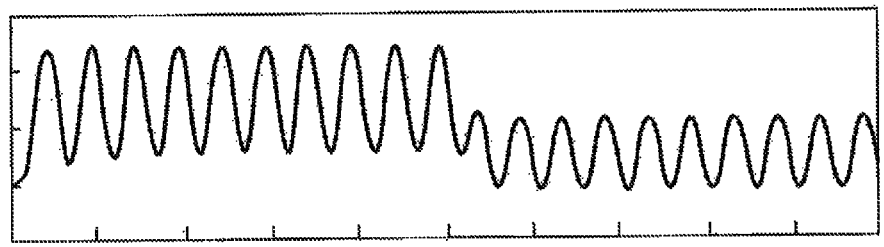
FIG. 10E is a graph representing how the position of a characteristic tuning member changes when the target value shown in FIG. 10A is provided.
Figure 10F:
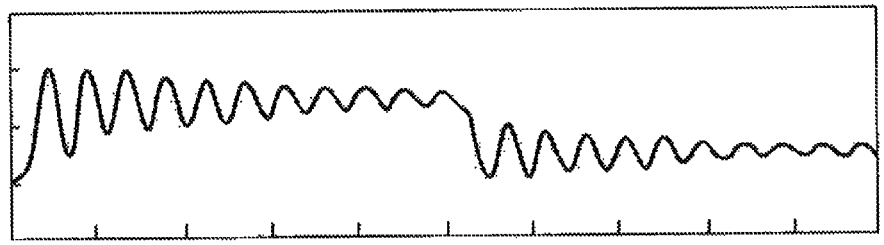
FIG. 10F is a graph representing how the position of a characteristic tuning member changes when the target value shown in FIG. 10A is provided.

FIG. 10E shows an example of how the position (x) of the characteristic tuning member 4 changes when the FF-I control is applied (the "–P" control is not applied) but the notch filtering is not applied. FIG. 10F shows an example of how the position (x) of the characteristic tuning member 4 changes when both the FF-I control and the notch filtering are applied. In the examples shown in FIG. 10E and FIG. 10F, the settling time is long and steady vibration remains, as compared with the examples shown in FIG. 10C and FIG. 10D.

In the example shown in FIG. 10C, the settling time is short, as compared with the other examples, but a certain degree of overshooting is unavoidable. In contrast, the controller 21 included in the control apparatus 18 of the present embodiment preforms shaping processing for the target value 25(r) and the overshooting of the characteristic tuning member 4 is effectively suppressed thereby.

To be specific, the controller 21 includes a target value shaper 200, a subtractor 210, a notch filter 220 and an FF-I-P compensator 230. The subtractor 210 shown in FIG. 11 differs from the subtractor 210 shown in FIGS. 8 and 9 in that target value 26($r_s$) is entered in place of target value 25(r).

Figure 12:
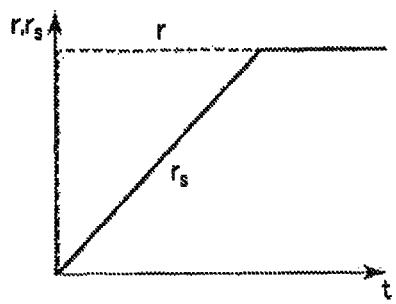
FIG. 12 is a graph representing how the target value generated by the target value shaper depicted in FIG. 11 changes.

The target value shaper 200 generates target value 26($r_s$) by shaping the entered target value 25(r). To be specific, target value 26($r_s$) changes substantially rampwise, as shown in FIG. 12, until it reaches target value 25(r). Since target value 26($r_s$) changes substantially at the constant speed until it reaches target value 25(r), the overshooting of the characteristic tuning member 4 is suppressed. Target value $26(r_s)$ does not have to change at a constant speed (that is, at a fixed slope). For example, it may be subjected to s-shaped acceleration and deceleration control.

Figure 15:
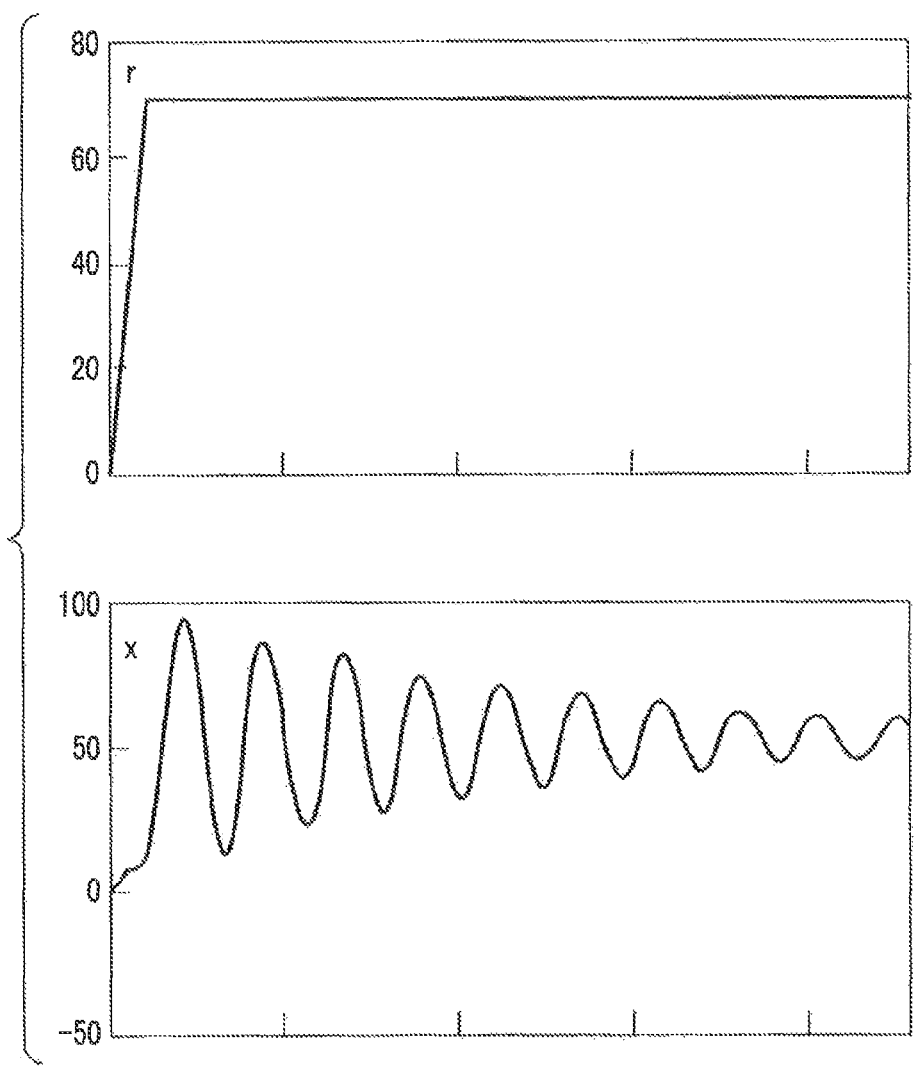
FIG. 15 shows graphs representing how a target value changes and how the position of a characteristic tuning member changes when the target value is provided.
Figure 16:
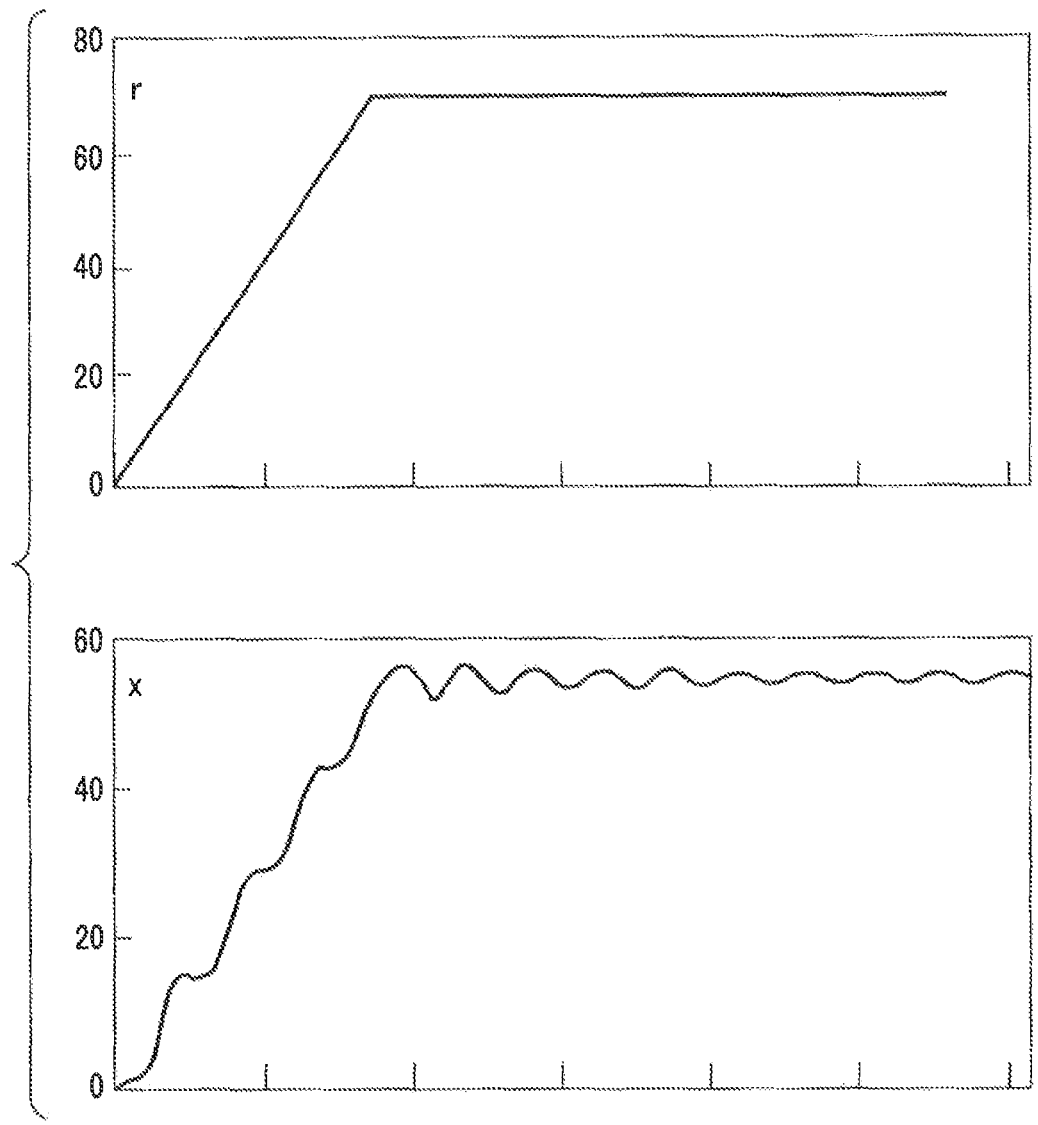
FIG. 16 shows graphs representing how a target value changes and how the position of a characteristic tuning member changes when the target value is provided.

When the rate of change of target value $26(r_s)$ is low, the overshooting suppression effect is noticeable, as shown in FIG. 16. At the same time, however, the time requires for target value $26(r_s)$ to reach target value 25(r) is long, and the settling time is lengthened, accordingly. On the other hand, when the rate of change of target value $26(r_s)$ is high, the adverse effect on the settling time can be reduced, as shown in FIG. 15, but the overshooting suppression effect weakens.

Therefore, the target value shaper 200 changes target value $26(r_s)$ at a predetermined speed (at a constant speed) or in a predetermined time (at equal intervals) based on the movement time ($t_s$) required for target value 26(r) to change from a current value (which is typically equal to unchanged target value 25(r)) to target value 26(r) while changing substantially rampwise at the predetermined speed (at constant speed).

Figure 14:
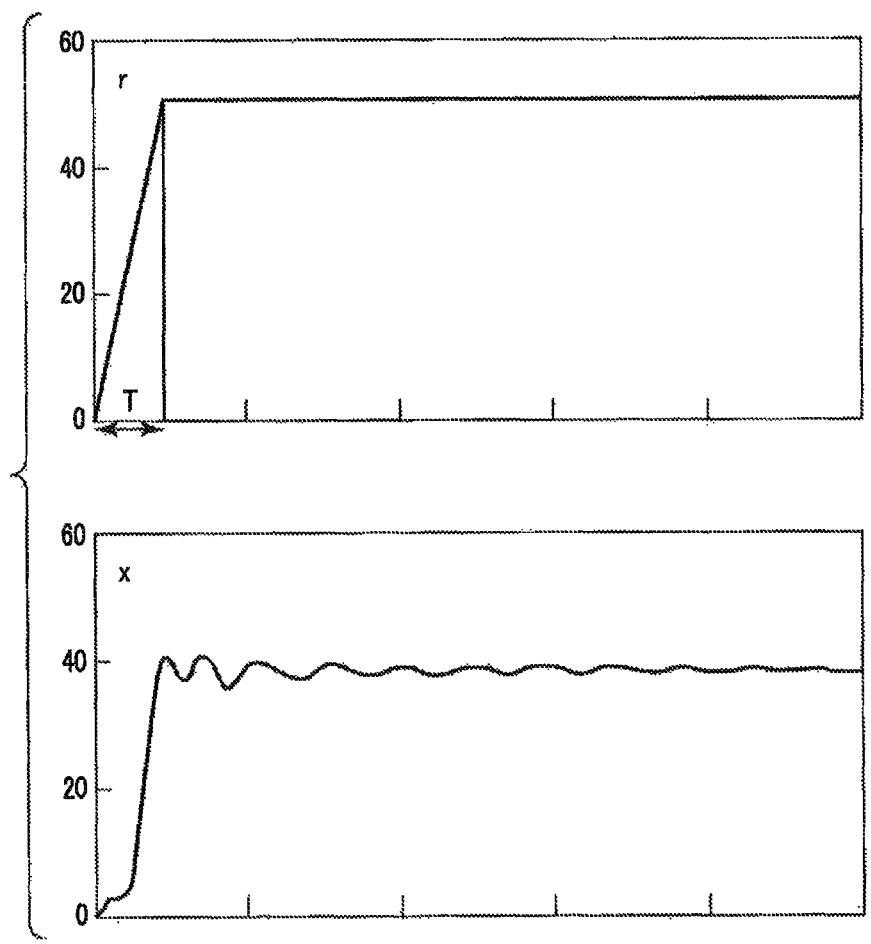
FIG. 14 shows graphs representing how a target value changes and how the position of a characteristic tuning member changes when the target value is provided.

To be specific, a period (T) corresponding to the main resonance frequency (F), one of the resonance frequencies of the characteristic tuning member 4 (a controlled object) is used as a threshold value (T is equal to the inverse number of F). As can be seen from FIG. 14, target value $26(r_s)$ is changed to target value 25(r) substantially rampwise over a time equal to or shorter than period (T). By changing target value $26(r_s)$ in this manner, overshooting can be suppressed and yet the adverse effect on the setting time can be reduced.

When the controller 21 changes target value $26(r_s)$ discretely, the predetermined time mentioned above may be longer or shorter than the period (T) by the time corresponding to fractions. Where the I gain is small and target value $26(r_s)$ is changed in period (T), the change in the position (x) of the characteristic tuning member 4 may be slower than target value $26(r_s)$. In this case, the predetermined time may be set to be shorter than period (T) in order that the change in the position (x) of the characteristic tuning member 4 can approach target value $26(r_s)$.

For example, if the movement time ($t_s$) is equal to or smaller than the threshold value (T), the target value shaper 200 changes target value $26(r_3)$ at the predetermined speed. If the movement time ($t_3$) is larger than the threshold value (T), the target value shaper 200 changes target value $26(r_s)$ in the predetermined time (which is equal to the threshold value (T)).

The predetermined speed can be based on the overshooting amount of the characteristic tuning member 4 used as a controlled object. For example, the predetermined speed may be designed in such a manner that the overshooting amount obtained when target value $26(r_s)$ changes substantially rampwise at the predetermined speed is within an allowable range (for example, a range in which the characteristic tuning member 4 does not collide with the superconducting filter substrate). If a speed that permits the overshooting amount to be within the predetermined range cannot be determined, then the movement may be defined in relation to the predetermined time in any case, without setting any speed.

Figure 20:
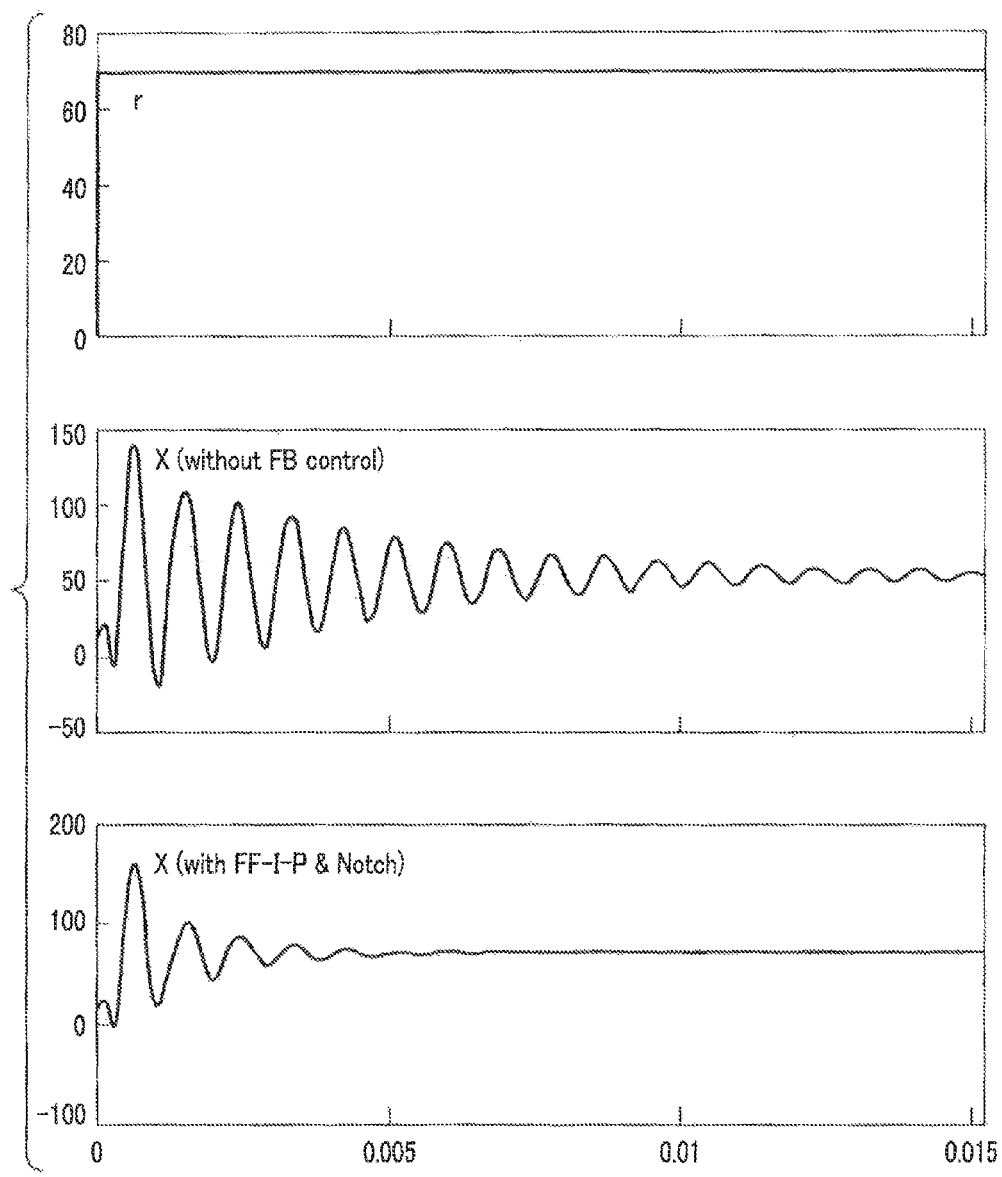
FIG. 20 shows graphs representing how a target value changes and how the position of a characteristic tuning member changes when the target value is provided.
Figure 21:
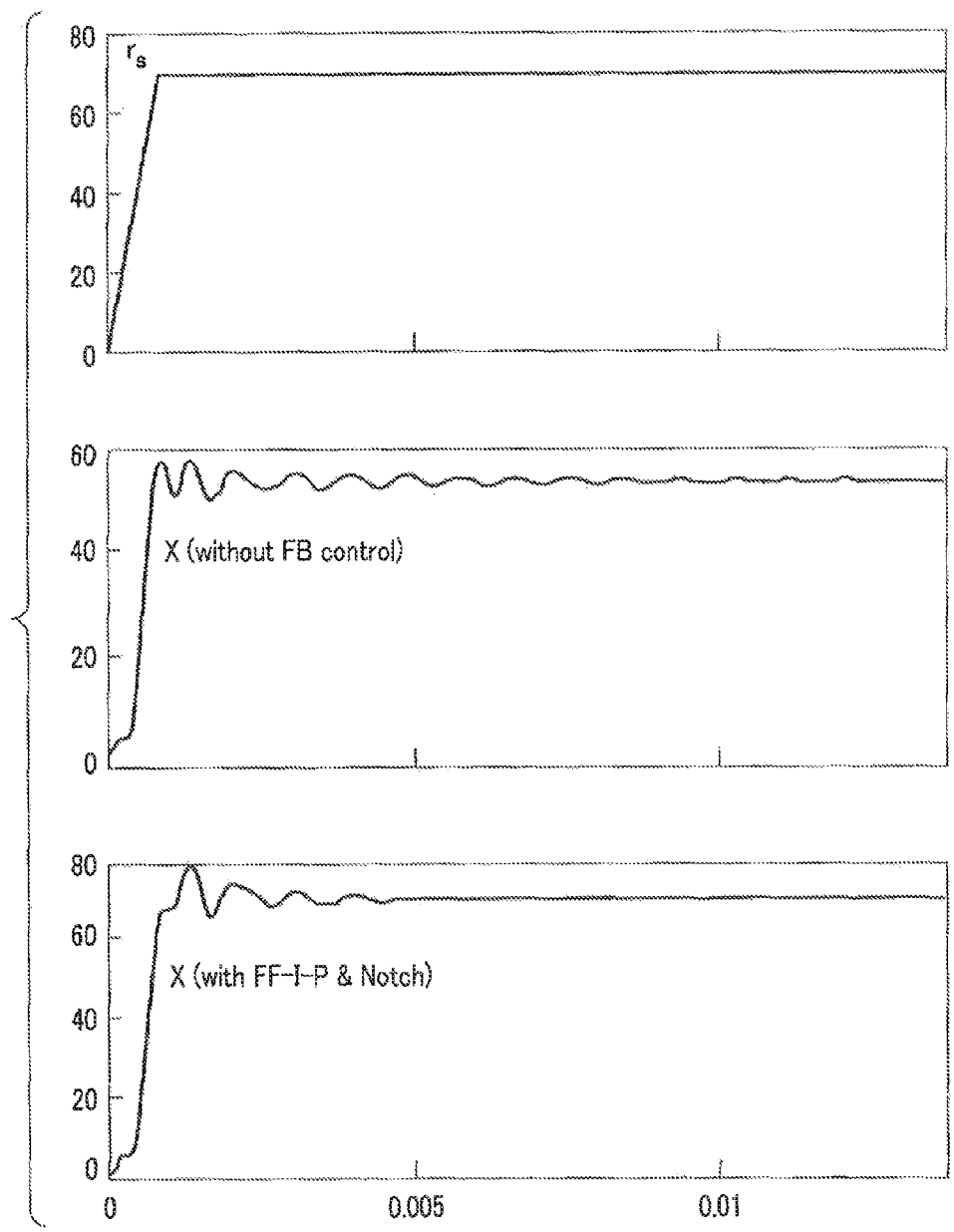
FIG. 21 shows graphs representing how a target value changes and how the position of a characteristic tuning member changes when the target value is provided.
Figure 22:
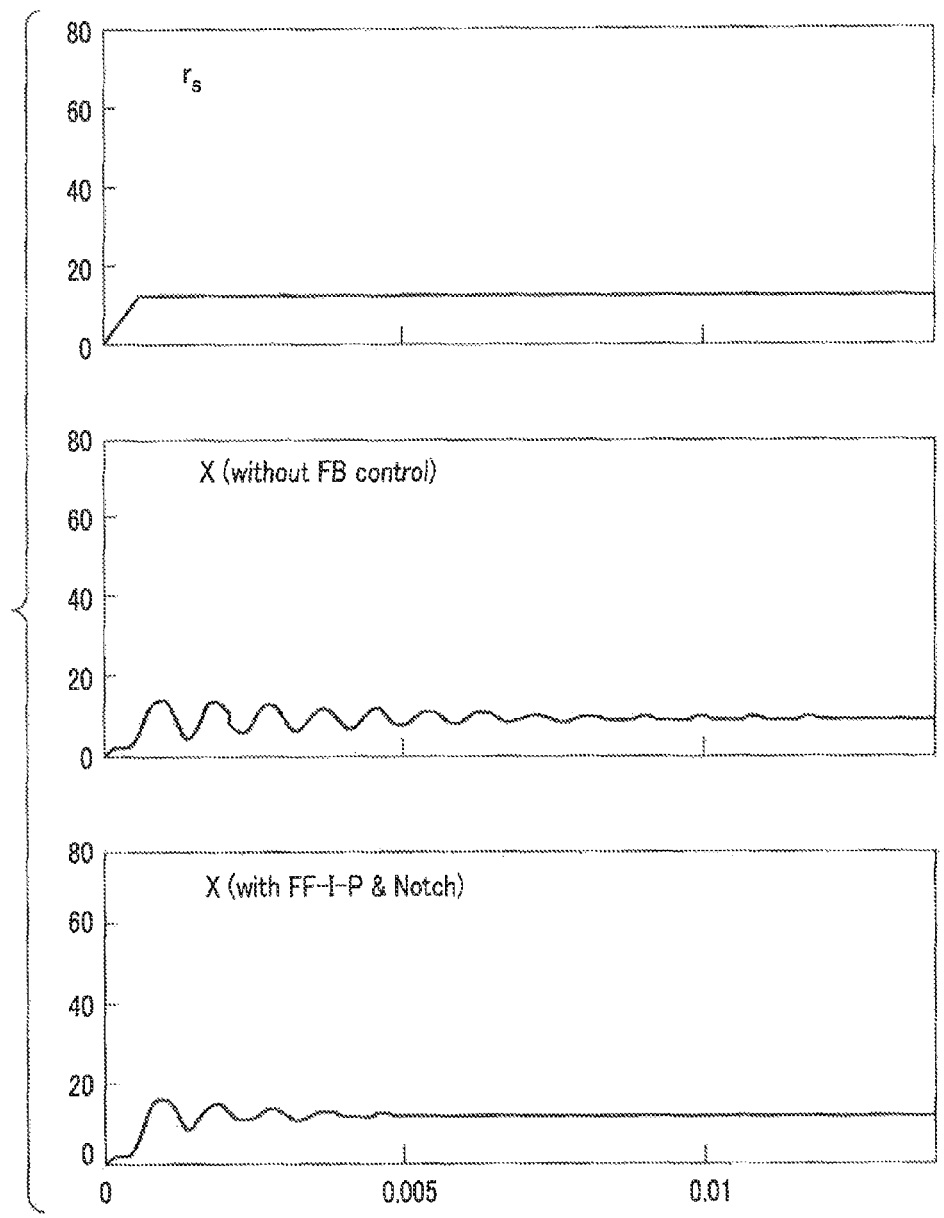
FIG. 22 shows graphs representing how a target value changes and how the position of a characteristic tuning member changes when the target value is provided.

FIG. 21 shows how the position of the characteristic tuning member 4 changes when target value $26(r_s)$ changes in the predetermined time. FIG. 22 shows how the position of the characteristic tuning member 4 changes when target value $26(r_s)$ changes at the predetermined speed. For comparison, FIG. 20 shows how the position of the characteristic tuning member 4 changes when target value 25(r) is not shaped.

From FIG. 20, FIG. 21 and FIG. 22, it can be observed that the overshooting can be effectively suppressed by changing target value $26(r_s)$ either at the predetermined speed or in the predetermined time. The effect mentioned above is not limited to the case where the FF-I-P control and the notch filtering are applied. The similar effect can be observed even if the feedback control is not applied.

Figure 18:
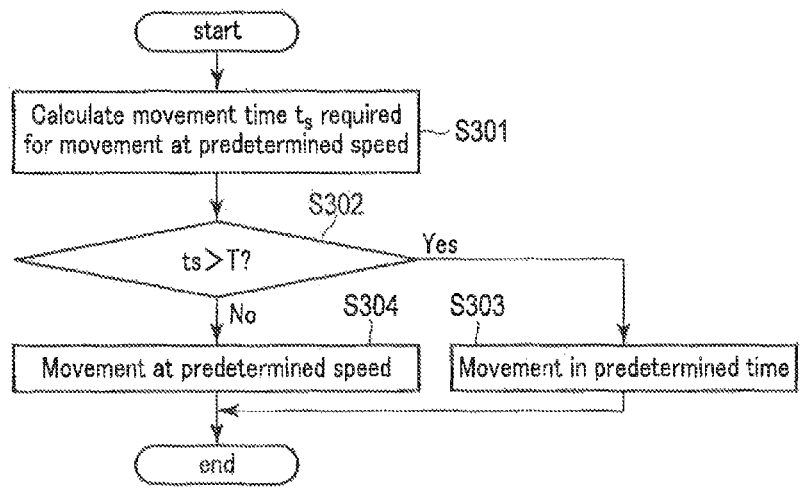
FIG. 18 is a flowchart illustrating an example of an operation of the target value shaper depicted in FIG. 11.

The target value shaper 200 operates in such a manner as is illustrated in FIG. 18. When a new target value 25(r) is provided, the target value shaper 200 calculates a movement time ($t_s$) which is required for target value $26(r_s)$ to change from the current value substantially rampwise at the predetermined speed and reach target value 25(r) (Step S301).

The target value shaper 200 compares the movement time ($t_s$) calculated in Step S301 with the period (T) corresponding to the main resonance frequency (F) of the characteristic tuning member 4 (Step S302). If the value of $t_s$ is larger than the value of T, the processing flow advances to Step S303. If the value of $t_s$ is not larger than the value of T, the processing flow advances to S304.

Figure 17:
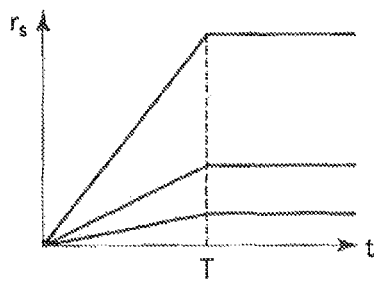
FIG. 17 is a graph representing how a target value generated by the target value shaper depicted in FIG. 11 changes.

In Step S303, the target value shaper 200 changes target value $26(r_s)$ substantially rampwise in the predetermined time until target value $26(r_s)$ becomes equal to target value 25(r). As shown in FIG. 17, in step S303, the rate of change of target value $26(r_s)$ is dependent on the difference between target value $26(r_s)$ and target value 25(r) and is not uniform, but the rate of change is faster than the predetermined speed.

Figure 13:
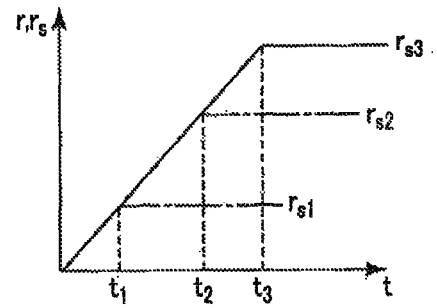
FIG. 13 is a graph representing how the target value generated by the target value shaper depicted in FIG. 11 changes.

In Step S304, the target value shaper 200 changes target value $26(r_s)$ substantially rampwise at the predetermined speed until target value $26(r_s)$ becomes equal to target value 25(r). As shown in FIG. 13, the time required for target value $26(r_s)$ to become equal to target value 25(r) is dependent on the difference between target value $26(r_s)$ and target value 25(r) and is not uniform, but that time is equal to or shorter than the period (T).

Figure 19:
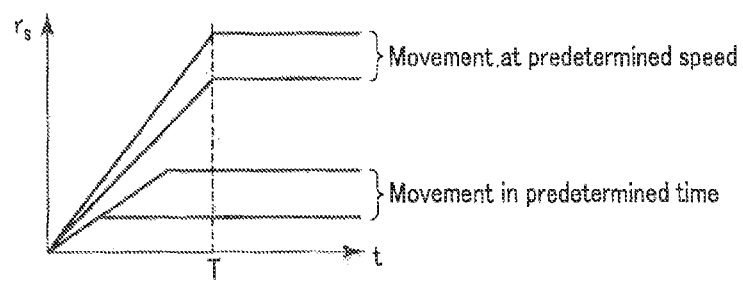
FIG. 19 is a graph representing how a target value changes and how the position of a characteristic tuning member changes when the target value is provided.

As shown in FIG. 19, therefore, target value $26(r_s)$ becomes equal to target value 25(r) in a time equal to or shorter than the period (T) corresponding to the main resonance frequency (F) of the characteristic tuning member 4.

As described above, the control apparatus of the first embodiment shapes a first target value representing the target position of a controlled object and thereby generates a second target value which changes substantially rampwise over a time equal to or shorter than the period corresponding to one of the resonance frequencies of the controlled object until the second target value becomes equal the first target value. In the position control, therefore, the control apparatus can suppress the overshooting and reduces the adverse effect on the settling time.

The control apparatus of the present embodiment does not necessarily apply both the feedforward control and the feedback control (specifically, the I control and "–P" control (or "I" control)). To be more specific, the control apparatus may solely apply the feedforward control until target value $26(r_s)$ reaches target value 25(r), and apply the feedback control in addition to the feedforward control after target value $26(r_s)$ reaches target value 25(r).

Figure 23:
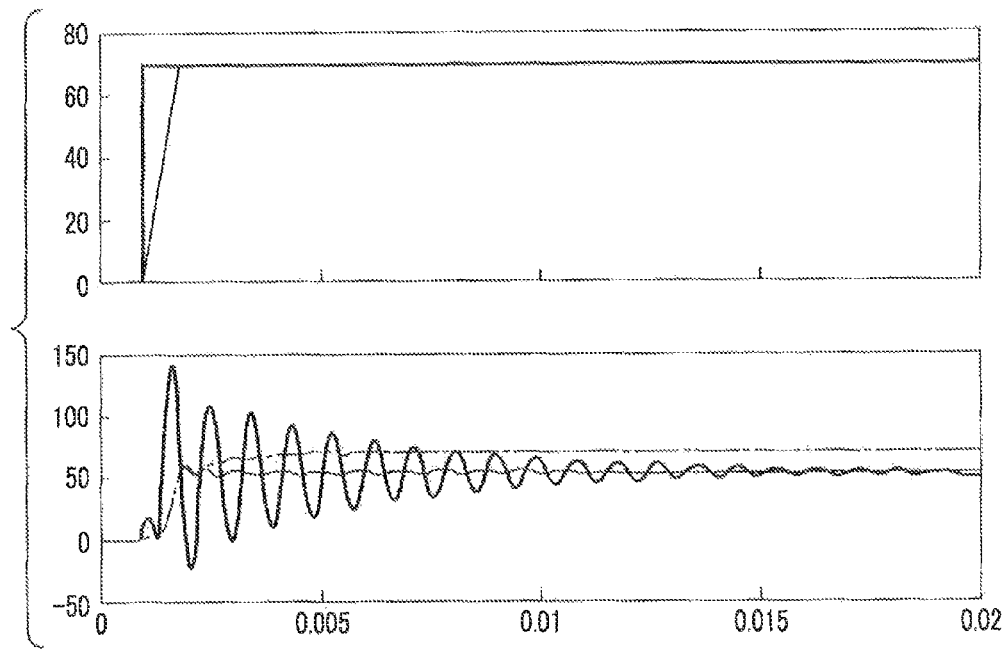
FIG. 23 shows graphs representing how a target value changes and how the position of a characteristic tuning member changes when the target value is provided.

In the upper graph in FIG. 23, the thin solid line represents changes in target value $26(r_s)$, and the bold solid line represents changes in value 25(r). In the lower graph in FIG. 23, the dashed line represents how the position of the characteristic tuning member 4 changes when the feedforward control and the feedback control are selectively applied in the above-mentioned way, the thin solid line represents how the position of the characteristic tuning member 4 changes when the feedback control is not applied, and the bold solid line represents how the position of the characteristic tuning member 4 changes when the shaping of target value 25(r) is not performed.

The control apparatus of the present embodiment may be applied to not only the position control of the characteristic tuning member 4 mentioned above but also the position control of a variety of objects. With respect to a controlled object, however, the resonance frequency thereof should not depend on a target value. A target value in position control is not limited to a position but may be an angle.

Second Embodiment

The control apparatus of the first embodiment applies both the feedforward control and the feedback control to one driving element (e.g., one piezoelectric element). In contrast, a control apparatus of the second embodiment applies the feedforward control to a first driving element and applies the feedback control to a second driving element.

Figure 24:
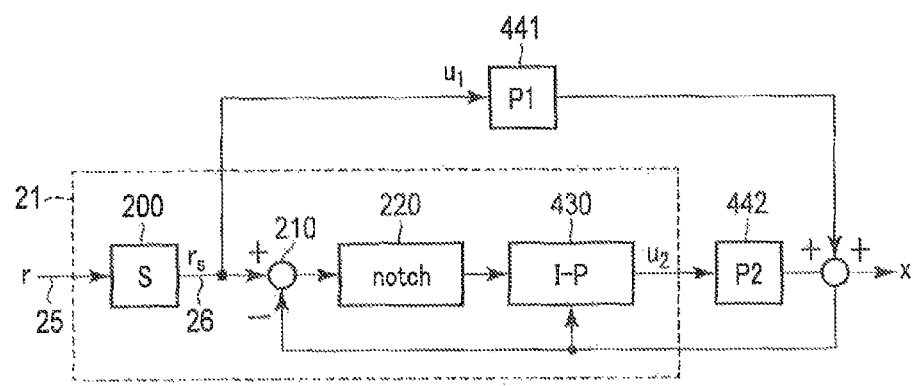
FIG. 24 is a block diagram illustrating an example of a controller included in the control apparatus of the second embodiment.

To be specific, the controller 21 of the control apparatus of the second embodiment includes a target value shaper 200, a subtractor 210, a notch filter 220 and an I-P compensator 430, as shown in FIG. 24.

Figure 11:
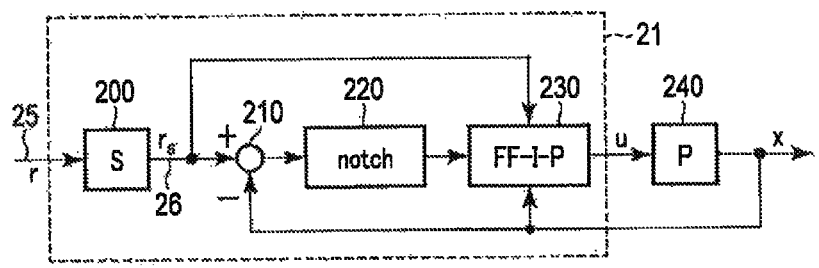
FIG. 11 is a block diagram illustrating an example of a controller included in the control apparatus of the first embodiment.

The target value shaper 200 shown in FIG. 24 differs from the target value shaper shown in FIG. 11 in that it outputs target value $26(r_s)$ as the first operation amount $(u_1)$ of the first driving element (e.g., piezoelectric element 8). The first driving element is an object to which the feedforward control is applied.

The notch filter 220 shown in FIG. 24 differs from the notch filter 220 shown in FIG. 11 in that it supplies a residual signal subjected to filtering to the I-P compensator 430, not to the FF-I-P compensator 230.

The I-P compensator 430 determines a second operation amount $(u_2)$ of the second driving element (e.g., piezoelectric element 9) based on the residual signal subjected to filtering processing. The second driving element is an object to which the feedback control is applied.

The plant 441 (P1) is a combination of a driving circuit 23, a first driving element, a strain gauge 17 and a signal processing circuit 19. The plant 441 (P1) corresponds to a transfer function for transfer from the first operation amount $(u_1=r_s)$ to the position (x) of the characteristic tuning member 4.

The plant 442 (P2) is a combination of a driving circuit 23, a second driving element, a strain gauge 17 and a signal processing circuit 19. The plant 442 (P2) corresponds to a transfer function for transfer from the second operation amount $(u_2)$ to the position (x) of the characteristic tuning member 4.

In order to permit the position of the characteristic tuning member 4 to converge to the target position, both a driving force (namely, feedforward control) and a damping force (namely, feedback control) are required. In order to apply both the feedforward control and feedback control to one driving element, the driving circuit 23 requires a high-output amplifier which generates sufficiently high driving voltage 24a or driving voltage 24b. Where the feedforward control and the feedback are applied to different driving elements, the maximum value of driving voltage 24a or driving voltage 24b can be suppressed.

Although both piezoelectric elements 8 and 9 can be extended in accordance with an increase in the voltage applied to them, they cannot be contracted from the states when the application voltage is 0. Therefore, if the first operation amount $(u_1)$ or the second operation amount $(u_2)$ is a negative value, the piezoelectric element 8 or 9 may not be properly operated. At the start of position control, therefore, an appropriate voltage may be applied to the piezoelectric elements 8 and 9, as shown in FIG. 4A. In this case, the piezoelectric elements 8 and 9 applied with that voltage are offset to the center of the deformable range, and the position which the characteristic tuning member 4 takes in the offset state of the piezoelectric elements 8 and 9 is set as "displacement 0."

Figure 25:
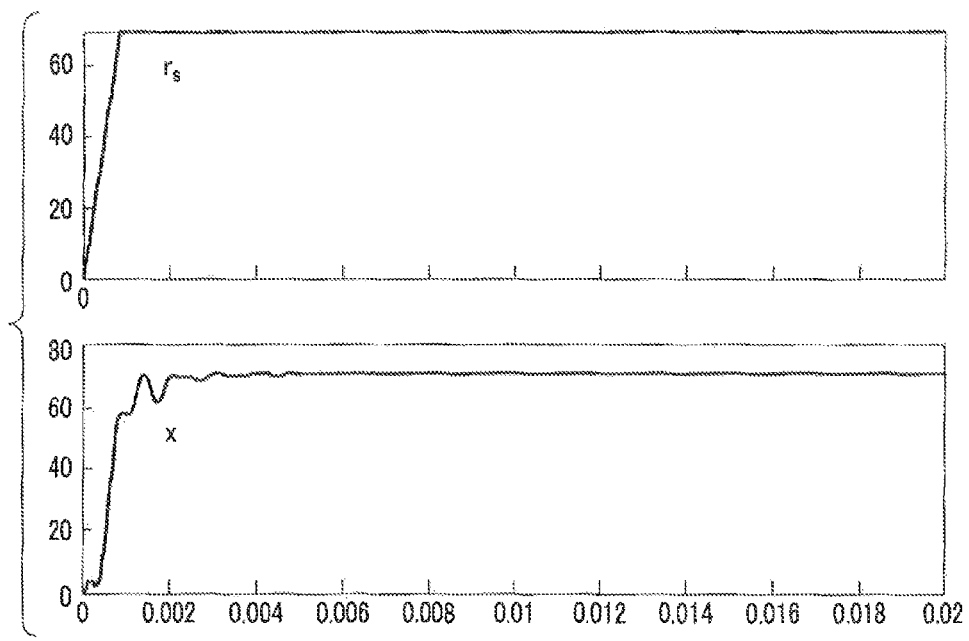
FIG. 25 shows graphs representing how a target value changes and how the position of a characteristic tuning member changes when the target value is provided.

The control apparatus may apply the feedforward control to the first driving element until target value $26(r_s)$ reaches target value 25(r), and apply the feedforward control to the first driving element and the feedback control to the second driving element after target value $26(r_s)$ reaches target value 25(r). By selectively applying the feedforward control and the feedback control in this manner, the overshooting can be effectively suppressed, as shown in FIG. 25.

As described above, the control apparatus of the second embodiment applies the feedforward control to the first driving element and applies the feedback control to the second driving element. Therefore, this control apparatus can reduce the maximum values of the driving voltages applied to the first and second driving elements, and the amplifier for generating the driving voltages does not require high performance.

Third Embodiment

A tunable filter apparatus according to the third embodiment can control the position of a characteristic tuning member by employing the control apparatus of the first or second embodiment.

Figure 26:
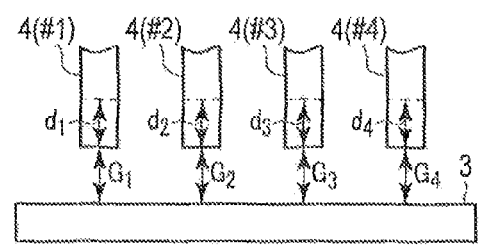
FIG. 26 is an explanatory diagram illustrating how gap lengths and the position of a characteristic tuning member are in a tunable filter apparatus of the third embodiment.

To be specific, the tunable filter apparatus corresponds to a bandpass filter and includes at least four characteristic tuning member 4 (#1 to #4) so that the phase of a signal within a pass band can be changed up to 360 degrees. As shown in FIG. 26, the tunable filter apparatus individually controls the positions of the characteristic tuning members 4(#1) to 4(#4) (specifically, displacements d1 to d4 from the initial positions), thereby adjusting the gap lengths $G_1$ to $G_4$ between the characteristic tuning members 4(#1) to 4(#4) and the resonators formed on the first surface of the superconducting filter substrate 3. The displacement $d_n$ has a greater value as the position of the characteristic tuning member 4(#n) is closer to the resonator. As a result, the tunable filter apparatus achieves a desirable filter characteristic (e.g., the center frequency of a pass band).

Target value 25(r) is a combination $(d_{1,m}, d_{2,m}, d_{3,m}, d_{4,m})$ of displacements $d_n$ corresponding to a desirable filter characteristic $f_m$ and can be derived using the lookup table shown below. It is noted here that n is an integer which is not less than 1 and not more than 4.

|  |  | center frequency of pass band | | |
| --- | --- | --- | --- | --- |
|  |  | $f_1$ | $f_2$ | $f_3$ |
| characteristic tuning member | 4 (#1) | $d_{1,1}$ | $d_{1,2}$ | $d_{1,3}$ |
|  | 4 (#2) | $d_{2,1}$ | $d_{2,2}$ | $d_{2,3}$ |
|  | 4 (#3) | $d_{3,1}$ | $d_{3,2}$ | $d_{3,3}$ |
|  | 4 (#4) | $d_{4,1}$ | $d_{4,2}$ | $d_{4,3}$ |

Ideally, the displacements and $d_{1,m}$, $d_{2,m}$, $d_{3,m}$ and $d_{4,m}$ should be equal to each other. In practice, however, they are not necessarily equal. This difference is attributable to an error in the installation positions of the characteristic tuning members 4(#1) to 4(#4), a conversion error which may be caused when the distortions detected by the strain gauges 17 corresponding to the characteristic tuning members 4(#1) to 4(#4) are converted to displacements etc.

As shown in FIG. 27, if $f_1 < f_2 < f_3$, then $d_{n,1} > d_{n,2} > d_{n,3}$. In addition, when the desirable filter characteristic is changed from $f_{m1}$ to $f_{m2}$, the moving amounts of the characteristic tuning members 4 ($d_{n,m2}$-$d_{n,m1}$) are not necessarily equal to each other. Therefore, when the desirable filter characteristic (namely, the control signal 22) is changed, the characteristic tuning members 4(#1) to 4(#4) move in the same direction but in individual manners. In FIG. 27, the characteristic tuning members 4(#1) to 4(#4) are shown as starting movements simultaneously, but their movement start timings do not have to the same.

As described above, the tunable filter apparatus of the third embodiment moves a plurality of characteristic tuning members in the same direction but in individual manners in accordance with a desirable filter characteristic. Therefore, the tunable filter apparatus can achieve the desirable filter characteristic without reference to an error in the installation positions of the characteristic tuning members, a conversion error which may be caused when the distortions detected with respect to the characteristic tuning members are converted to displacements, etc.

Fourth Embodiment

A tunable filter apparatus according to the fourth embodiment differs from the tunable filter apparatus of the third embodiment in that a cold plate is thermally isolated from a tunable mechanism.

Figure 29:
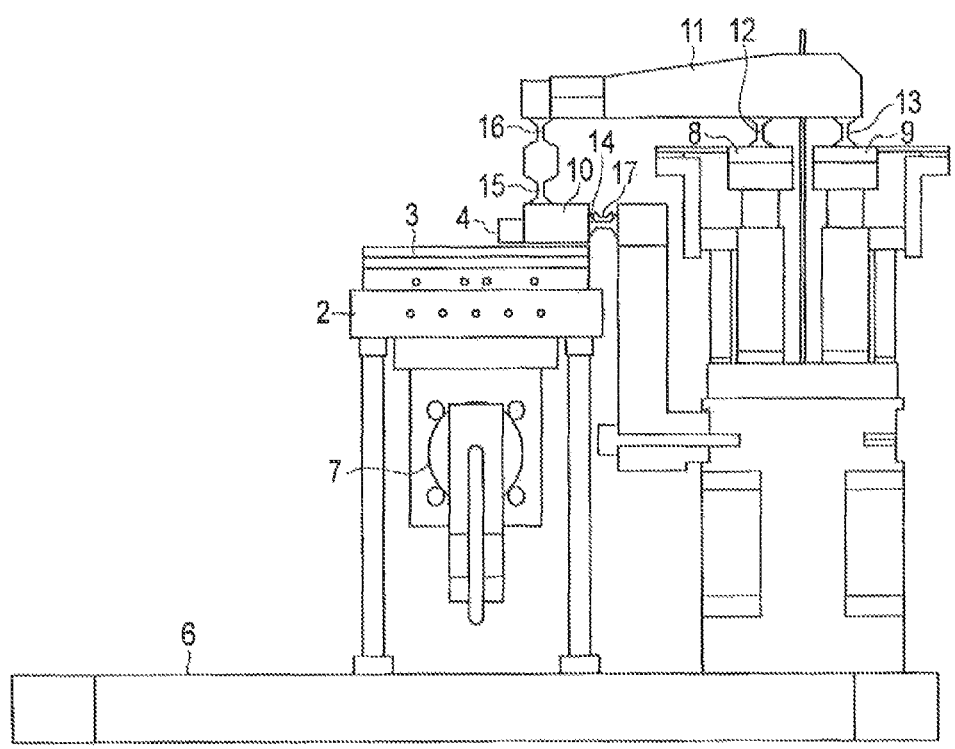
FIG. 29 is a sectional view of a tunable filter apparatus of the fourth embodiment.

As shown in FIG. 29, the tunable filter apparatus of the fourth embodiment comprises a cold plate 2, a superconducting filter substrate 3, a characteristic tuning member 4, a base 6, refrigerator 7, piezoelectric element 8, piezoelectric element 9, lever 10, lever 11, elastic hinge 12, elastic hinge 13, elastic hinge 14, elastic hinge 15, elastic hinge 16 and a strain gauge 17. Piezoelectric element 8, piezoelectric element 9, lever 10, lever 11, elastic hinge 12, elastic hinge 13, elastic hinge 14, elastic hinge 15, elastic hinge 16 and the strain gauge 17 jointly correspond to the tunable mechanism 5 described above.

Figure 3:
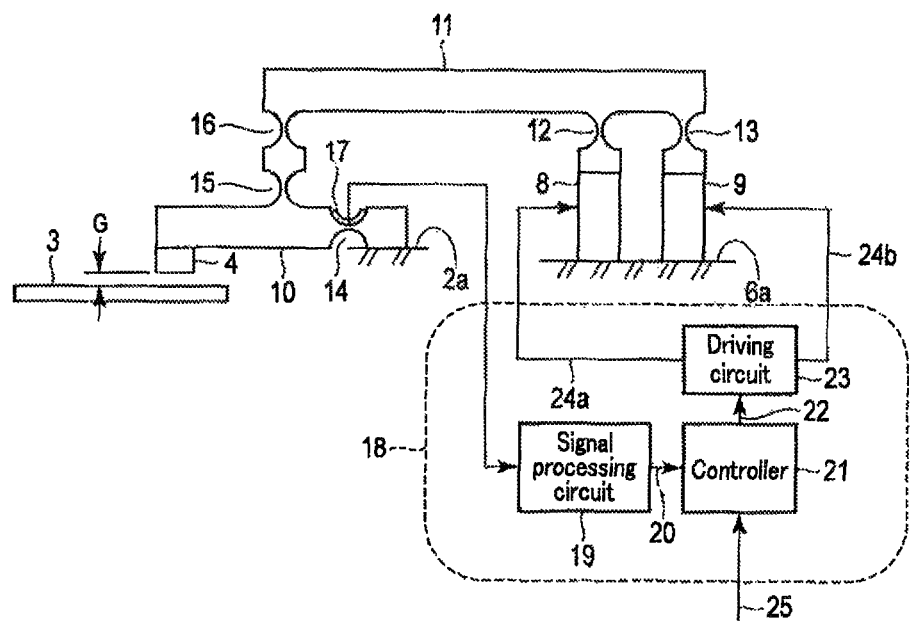
FIG. 3 is a block diagram illustrating the tunable mechanism depicted in FIG. 1 and the control apparatus of the first embodiment.

Lever 10 shown in FIG. 29 differs from levers 10 shown in FIGS. 3 and 28 in that the second end thereof is supported by the base 6 by means of elastic hinge 14. Since lever 10 shown in FIG. 29 is not in contact with the cold plate 2, the heat generated in the tunable mechanism 5 does not transfer to the cold plate 2. Accordingly, the superconducting filter substrate 3 is kept in a low-temperature state.

As described above, the tunable filter apparatus of the fourth embodiment is featured in that the cold plate is thermally isolated from the tunable mechanism. Since the tunable filter apparatus can easily keep the superconducting filter substrate in a low-temperature state, a desirable filter characteristic is achieved.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Additional Note

In the following, a tunable filter apparatus according to a combination of the first to fourth embodiments will be additionally described.

[1] A tunable filter apparatus comprising: a substrate; a plurality of resonators that are formed on a first surface of the substrate by patterning, using a conductive material; a plurality of characteristic tuning members that comprise at least one of a dielectric material, a magnetic material and a conductive material; a plurality of tunable mechanisms that support the characteristic tuning members such that the characteristic tuning members face the resonators and that control the characteristic tuning member based on a control signal; a shaper that receives a first target value in position control of each of the characteristic tuning members and generates a second target value which changes substantially rampwise toward the first target value over a time equal to or shorter than a period corresponding to one of resonance frequencies of the characteristic tuning member; and a compensator that compensates for the control signal based on the second target value, wherein the control signal changes in accordance with a desired filter characteristic, and the tunable mechanisms individually move the characteristic tuning members in a common direction in response to a change in the control signal.

[2] The apparatus according to [1], wherein the shaper that (a) generates a second target value changing toward the first target value substantially rampwise at a first speed, if a movement time required for the second target value to change substantially rampwise at the first speed and become equal to the first target value is equal to or shorter than the period, and (b) generates a second target value changing toward the first target value substantially rampwise at a second speed faster than the first speed over a time equal to the period, if the movement time exceeds the period.

[3] The apparatus according to [2], wherein the first speed is determined based on how an overshooting amount of the characteristic tuning member is when the second target value changes substantially rampwise at the first speed.

[4] The apparatus according to [1], wherein the compensator applies feedforward control until the second target value becomes equal to the first target value, and applies feedback control as well as the feedforward control after the second target value reaches the first value.

[5] The apparatus according to [1], wherein the characteristic tuning member is moved in accordance with a driving force supplied from at least one of a first driving element and a second driving element.

[6] The apparatus according to [5], wherein the compensator applies feedforward control to the first driving element and applies feedback control to the second driving element.

[7] The apparatus according to [6], wherein the compensator applies the feedforward control to the first driving element until the second target value becomes equal to the first target value, and applies the feedforward control to the first driving element as well as the feedback control to the second driving element after the second target value reaches the first value.

What is claimed is:

1. A control apparatus comprising:
   a shaper that receives a first target value in position control of a controlled object and generates a second target value which changes substantially rampwise over a time equal to or shorter than a period corresponding to one of resonance frequencies of the controlled object until the second target value becomes equal the first target value; and a compensator that compensates for a control signal, used for controlling the controlled object, based on the second target value.

2. The apparatus according to claim 1, wherein the shaper that (a) generates the second target value changing toward the first target value substantially rampwise at a first speed, if a movement time required for the second target value to change substantially rampwise at the first speed and become equal to the first target value is equal to or shorter than the period, and (b) generates the second target value changing toward the first target value substantially rampwise at a second speed faster than the first speed over a time equal to the period, if the movement time exceeds the period.

3. The apparatus according to claim 2, wherein the first speed is determined based on how an overshooting amount of the controlled object is when the second target value changes substantially rampwise at the first speed.

4. The apparatus according to claim 1, wherein the compensator applies feedforward control until the second target value becomes equal to the first target value, and applies feedback control as well as the feedforward control after the second target value reaches the first value.

5. The apparatus according to claim 1, wherein the controlled object is moved in accordance with a driving force supplied from at least one of a first driving element and a second driving element.

6. The apparatus according to claim 5, wherein the compensator applies feedforward control to the first driving element and applies feedback control to the second driving element.

7. The apparatus according to claim 6, wherein the compensator applies the feedforward control to the first driving element until the second target value becomes equal to the first target value, and applies the feedforward control to the first driving element as well as the feedback control to the second driving element after the second target value reaches the first value.

8. A tunable filter apparatus comprising:

a substrate;

a plurality of resonators that are formed on a first surface of the substrate by patterning, using a conductive material;

a plurality of characteristic tuning members that comprise at least one of a dielectric material, a magnetic material and a conductive material;

a plurality of tunable mechanisms that support the characteristic tuning members such that the characteristic tuning members face the resonators and that control the characteristic tuning member based on a control signal, a shaper that receives a first target value in position control of each of the characteristic tuning members and generates a second target value which changes substantially rampwise toward the first target value over a time equal to or shorter than a period corresponding to one of resonance frequencies of the characteristic tuning member; and a compensator that compensates for the control signal based on the second target value, wherein the control signal changes in accordance with a desired filter characteristic, and the tunable mechanisms individually move the characteristic tuning members in a common direction in response to a change in the control signal.

9. The apparatus according to claim 8, further comprising a cold plate that is cooled by a refrigerator and supports the substrate, and wherein the cold plate is thermally isolated from the tunable mechanisms.

* * * * *